(12) United States Patent
Sharon et al.

(10) Patent No.: US 10,474,525 B2
(45) Date of Patent: Nov. 12, 2019

(54) SOFT BIT TECHNIQUES FOR A DATA STORAGE DEVICE

(71) Applicant: SANDISK TECHNOLOGIES LLC, Addison, TX (US)

(72) Inventors: Eran Sharon, Rishon Lezion (IL); Ariel Navon, Revana (IL); Idan Alrod, Herzliya (IL); Alexander Bazarsky, Holon (IL)

(73) Assignee: SANDISK TECHNOLOGIES LLC, Addison, TX (US)

( * ) Notice: Subject to any disclaimer, the term of this patent is extended or adjusted under 35 U.S.C. 154(b) by 578 days.

(21) Appl. No.: 14/823,747

(22) Filed: Aug. 11, 2015

(65) Prior Publication Data

US 2017/0046220 A1 Feb. 16, 2017

(51) Int. Cl.
*G11C 11/56* (2006.01)
*G06F 11/10* (2006.01)
(Continued)

(52) U.S. Cl.
CPC .......... *G06F 11/1048* (2013.01); *G06F 3/064* (2013.01); *G06F 3/0619* (2013.01);
(Continued)

(58) Field of Classification Search
CPC ............. G06F 11/1068; G06F 11/1072; G06F 11/1008; G06F 11/1076; G06F 11/3055; G06F 11/0781; G06F 11/0751; G06F 11/079; G06F 11/3034; G06F 11/1451; G06F 3/0653; G06F 11/0709; G06F 11/0793; G06F 11/0727; G06F 11/327; G06F 13/4022; G06F 13/4282;
(Continued)

(56) References Cited

U.S. PATENT DOCUMENTS 6,661,927 B1 * 12/2003 Suarez .................. H04N 19/63
375/240.11
7,194,128 B1 * 3/2007 Payton .................. H04N 19/60
375/E7.226

(Continued)

FOREIGN PATENT DOCUMENTS

KR 1020110122529 * 6/2013 ............ H03M 13/11

OTHER PUBLICATIONS

Invitation to Pay Additional Fees and Partial Search Report for International Application No. PCT/US2016/036912, dated Sep. 13, 2016, 8 pages.

(Continued)

*Primary Examiner* — Samir W Rizk
*Assistant Examiner* — Enam Ahmed
(74) *Attorney, Agent, or Firm* — Michael Best & Friedrich LLP

(57) ABSTRACT

A data storage device includes a memory, a first module, and a second module. The first module is configured to sense data stored at the memory to generate a first set of soft bits having a first number of bits. The second module is configured to perform an operation using the first set of soft bits to generate a second set of soft bits having a second number of bits that is less than the first number of bits. In an illustrative implementation, the second set of soft bits is used in connection with a three-stage decoding process to decode a set of hard bits that represents the data.

26 Claims, 7 Drawing Sheets

(51) Int. Cl.
  *G11C 16/28* (2006.01)
  *G06F 3/06* (2006.01)
  *G11C 29/52* (2006.01)

(52) U.S. Cl.
  CPC ........ *G06F 3/0679* (2013.01); *G06F 11/1068* (2013.01); *G11C 11/5642* (2013.01); *G11C 16/28* (2013.01); *G11C 29/52* (2013.01)

(58) Field of Classification Search
  CPC .. G06F 11/3051; G06F 3/0604; G06F 3/0623; G06F 3/0629; G06F 3/0644; G06F 3/0605; G06F 3/0659; G06F 2201/84; G06F 11/048; G06F 3/0619; G06F 11/1048; G06F 3/0679; G06F 3/064; G11C 29/00; G11C 29/52; G11C 16/28; G11C 11/5642; H03M 13/3761; H03M 13/2909; H03M 13/616; H03M 13/1515; G06N 3/04; G06N 3/084; G06N 3/10; G06Q 10/20; G06Q 10/06316; G06Q 10/063116; H04L 63/101; H04L 9/3242; H04L 9/0894; H04L 9/0869; H04L 63/061; H04L 9/14
  USPC ....................................................... 714/773
  See application file for complete search history.

(56) References Cited

U.S. PATENT DOCUMENTS

| | | | |
|---|---|---|---|
| 8,099,652 B1 | 1/2012 | Alrod et al. | |
| 8,248,848 B1* | 8/2012 | Tang | G11C 11/56 365/185.03 |
| 8,464,131 B2 | 6/2013 | Sharon et al. | |
| 8,509,000 B2 | 8/2013 | Sharon et al. | |
| 8,873,285 B2 | 10/2014 | Sharon et al. | |
| 9,030,870 B2 | 5/2015 | Moschiano et al. | |
| 9,748,977 B2* | 8/2017 | Gendler | H03M 13/2906 |
| 2004/0119841 A1* | 6/2004 | Shimizu | H04N 1/00413 348/222.1 |
| 2004/0161156 A1* | 8/2004 | Matsubara | H04N 19/157 382/232 |
| 2005/0057995 A1* | 3/2005 | Mitani | G11C 8/10 365/222 |
| 2006/0140007 A1* | 6/2006 | Cernea | G11C 16/26 365/185.21 |
| 2009/0109747 A1* | 4/2009 | Radke | G11C 11/5621 365/185.03 |
| 2010/0165743 A1 | 7/2010 | Cernea | |
| 2012/0281790 A1* | 11/2012 | Sokolov | H04L 1/0052 375/341 |
| 2013/0024748 A1 | 1/2013 | Sharon et al. | |
| 2013/0139035 A1* | 5/2013 | Zhong | G11C 11/5642 714/773 |
| 2013/0343125 A1 | 12/2013 | Gillingham et al. | |
| 2014/0192583 A1* | 7/2014 | Rajan | G11C 7/10 365/63 |
| 2014/0237315 A1* | 8/2014 | Fitzpatrick | G06F 11/1012 714/755 |
| 2014/0237318 A1* | 8/2014 | Fitzpatrick | G06F 11/1012 714/763 |
| 2014/0281828 A1 | 9/2014 | Micheloni et al. | |
| 2014/0344647 A1* | 11/2014 | Chilappagari | H03M 13/1108 714/773 |
| 2015/0248325 A1* | 9/2015 | Calderbank | G06F 11/1048 714/768 |
| 2016/0253238 A1* | 9/2016 | Strauss | G06F 11/1072 714/721 |
| 2016/0328290 A1* | 11/2016 | Healy | G06F 3/0619 |
| 2017/0238361 A1* | 8/2017 | Pawar | H03M 7/40 455/561 |

OTHER PUBLICATIONS

International Search Report and Written Opinion of the International Searching Authority dated Nov. 4, 2016 in International Application No. PCT/US2016/036912, 19 pages.
International Preliminary Report on Patentability dated Feb. 13, 2018 in International Application No. PCT/US2016/036912, 13 pages.

* cited by examiner

SOFT BIT TECHNIQUES FOR A DATA STORAGE DEVICE

FIELD OF THE DISCLOSURE

This disclosure is generally related to data storage devices and more particularly to the use of soft bits during operation of data storage devices.

BACKGROUND

Non-volatile storage devices include flash memory devices and other storage devices. In a flash memory device, a storage element may be programmed to store a particular threshold voltage that indicates one or more bit values. For example, a particular range of threshold voltages may correspond to a logic "1" bit value, and another range of threshold voltages may correspond to a logic "0" bit value.

Non-volatile storage devices may use error correction techniques to improve reliability of data storage and retrieval. For example, data may be encoded prior to being stored at a storage device, and the data may be decoded after being read from the storage device to correct one or more errors in the data (up to an error correction capability, such as a probabilistic error correction capability).

Certain error correction techniques use soft bits to improve the error correction capability. A soft bit may indicate a reliability of a hard bit read from a storage element. As an example, a hard bit may indicate a logic "0" bit value, and a soft bit corresponding to the hard bit may indicate that the logic "0" bit value is relatively reliable (e.g., if a read voltage that reflects a state of a storage element is relatively far from the read threshold) or that the logic "0" bit value is relatively unreliable (e.g., if the read voltage indicating the state of the storage element is adjacent to a boundary of the target range of threshold voltages). Soft bits may improve a decoding process by indicating which bits of data are likely to be "incorrect" (e.g., due to being near a boundary of a threshold voltage range).

Generating and using soft bits consumes resources at a storage device. For example, additional sensing operations may be performed to generate soft bits (as compared to generating only hard bits during a read process). As another example, transferring soft bits from a memory to a controller may use system bandwidth and may reduce resources available for other operations, which may slow performance of the memory in some cases.

DETAILED DESCRIPTION

Figure 1A:
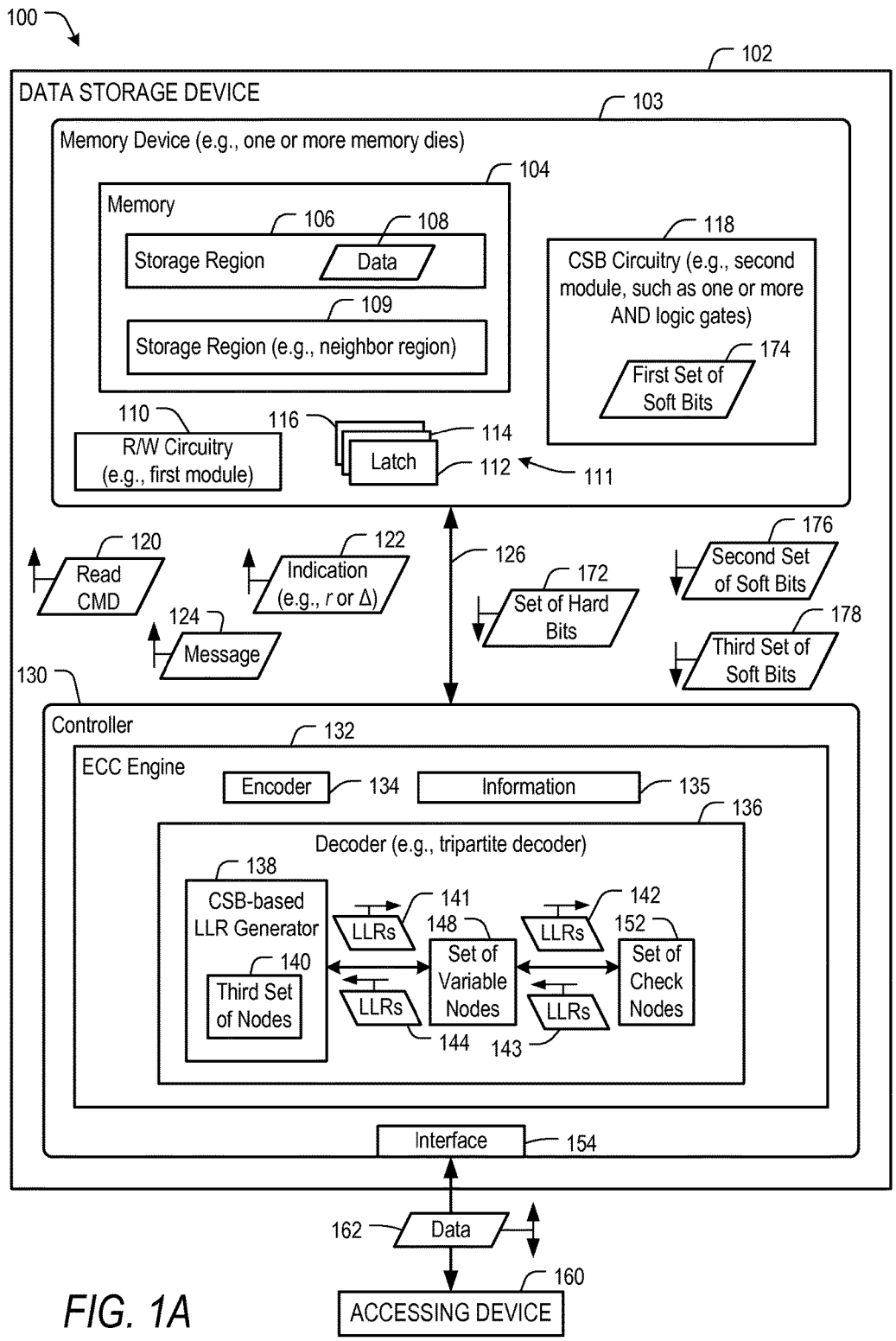
FIG. 1A is a block diagram of a particular illustrative example of a system including a data storage device configured to use compressed soft bits.

A data storage device may compress a set of soft bits in response to sensing the set of soft bits from a memory to reduce an amount of information transferred from the memory to a controller. In an illustrative implementation, a data storage device includes a memory device (e.g., one or more memory dies), and the memory device includes a memory, a first module (e.g., read/write circuitry) configured to perform a sensing process at the memory, and a second module (e.g., one or more logic gates, a set of latches, one or more other components, or a combination thereof). The first module is configured to sense data stored at a storage region of the memory to generate a set of hard bits and a first set of soft bits having a first bit count. For example, the first set of soft bits may include one bit per storage element of the storage region (e.g., in connection with a single-bit-per-cell data storage scheme) or multiple bits per storage element of the storage region (e.g., in connection with a multiple-bits-per-cell data storage scheme).

The second module is configured to perform an operation using the first set of soft bits to generate a second set of soft bits having a second bit count that is less than the first bit count. An example of the operation is an AND operation (e.g., an AND operation that compresses a first soft bit of "0" and a second soft bit of "1" to generate a compressed soft bit of "0"). In this example, a number of soft bits transferred from the memory to the controller may be reduced using the AND operation (because the second bit count is less than the first bit count). Because the size of the second set of soft bits is smaller than the size of the first set of soft bits as a result of "losing" the information included in one or more soft bits that cannot be retrieved, the compression achieved by applying the technique described above is a lossy compression'.

The second set of soft bits may be provided to a decoder of the data storage device for use in a decoding process to decode the set of hard bits. For example, the second set of soft bits may be used in connection with a three-stage (or tripartite) decoding process that utilizes compressed soft bits. To illustrate, a graphical model description of a low-density parity check (LDPC) ECC based decoder may include a first set of nodes (e.g., a set of variable nodes), a second set of nodes (e.g., a set of check nodes), and a third set of nodes (e.g., a set of compressed soft bit nodes). Each set of nodes may indicate a set of values, such as a set of log-likelihood ratio (LLR) values, and each set of nodes may provide a set of values to another set of nodes. The three-stage decoding scheme process may at least partially compensate for a loss of soft bit information that results from applying a lossy compression technique to generate the second set of soft bits. For example, the set of compressed soft bit nodes may update a set of LLR values provided by the set of variable nodes and may provide the updated set of LLR values to the set of variable nodes, such as in response to estimating which soft bit of a group of compressed soft bits is unreliable based on the set of LLR values provided by the set of variable nodes. Updating the set of LLR values provided by the set of variable nodes may improve accuracy of the decoding process (e.g., by compensating for loss of soft bit information that results from using lossy soft bit compression).

Particular aspects of the present disclosure are described below with reference to the drawings. In the description, common features are designated by common reference numbers. As used herein, "examplary" may indicate an example, an implementation, and/or an aspect, and should not be construed as limiting or as indicating a preference or a preferred implementation.

FIG. 1A depicts an illustrative example of a system 100. The system 100 includes a data storage device 102 and an accessing device 160 (e.g., a host device).

The data storage device 102 includes a memory device 103. The memory device 103 may include one or more memory dies (e.g., one memory die, two memory dies, eight memory dies, or another number of memory dies).

The memory device 103 includes a memory array 104, such as a non-volatile memory of storage elements included in a memory die. For example, the memory array 104 may include a flash memory (e.g., a NAND flash memory) or a resistive memory, such as a resistive random access memory (ReRAM), as illustrative examples. The memory array 104 may have a three-dimensional (3D) memory configuration. As an example, the memory array 104 may have a 3D vertical bit line (VBL) configuration. In a particular implementation, the memory array 104 is a non-volatile memory having a 3D memory array configuration that is monolithically formed in one or more physical levels of arrays of memory cells having an active area disposed above a silicon substrate. Alternatively, the memory array 104 may have another configuration, such as a two-dimensional (2D) memory configuration or a non-monolithic 3D memory configuration (e.g., a stacked die 3D memory configuration).

The memory array 104 includes one or more regions of storage elements, such as a storage region 106 and a storage region 109. An example of a storage region is a block, such as the basic memory unit on which an Erase operation is activated at a NAND Flash, or a group of resistance-based storage elements which are programmed in response to a single command in a ReRAM implementation. Another example of a storage region is a word line of storage elements (e.g., a word line of NAND flash storage elements or a "Finger" of physically neighboring storage cells of resistance-based storage elements). A storage region of the memory array 104 (e.g., the storage region 106 and/or the storage region 109) may be configured to store data (e.g., data 108) using a particular data storage scheme, such as using a single-bit-per-cell or multiple-bits-per-cell data storage scheme. To further illustrate, a storage region may have a single-level-cell (SLC) configuration, as a multi-level-cell (MLC) configuration, or as a tri-level-cell (TLC) configuration, as illustrative examples. Each storage element of the memory array 104 may be programmable to a state (e.g., a threshold voltage in a flash configuration or a resistive state in a resistive memory configuration) that indicates one or more values. As an example, in an illustrative TLC scheme, a storage element may be programmable to a state that indicates three values. As an additional example, in an illustrative MLC scheme, a storage element may be programmable to a state that indicates two values.

The memory device 103 may further include a first module (e.g., read/write circuitry 110) coupled to the memory array 104 and a second module, such as compressed soft bit (CSB) circuitry 118 and/or one or more latches (e.g., a set of latches 111, such as latches 112, 114, and 116). In some implementations, one or more CSB operations may be performed using the read/write circuitry 110. The memory array 104, the first module, and the second module may be integrated within a memory die of the memory device 103. Depending on the particular implementation, the CSB circuitry 118 may be coupled to one or more of the memory array 104, the read/write circuitry 110, one or more of the latches 112, 114, and 116, or a connection between the memory device 103 and the controller 130, such as a memory-to-controller bus 126. The CSB circuitry 118 may include one or more logic gates, such as one or more AND logic gates. Alternatively or in addition, the CSB circuitry 118 may include one or more other logic gates, such as one or more OR logic gates, one or more exclusive-OR (XOR) logic gates, one or more inverter (NOT) logic gates, one or more NOT-AND (NAND) logic gates, one or more NOT-OR (NOR) logic gates, one or more exclusive-NOR (XNOR) gates, one or more other logic gates, or a combination thereof. In some implementations, the CSB circuitry 118 (e.g., one or more logic gates) may be omitted from the memory device 103, and operations described with reference to the CSB circuitry 118 may be performed at the latches 112, 114, and 116 (e.g., using logical operations performed at the latches 112, 114, and 116).

The data storage device 102 may further include a controller 130. The controller 130 is coupled to the memory device 103 via a connection, such as a bus (e.g., the memory-to-controller bus 126), a wireless connection, another connection, or a combination thereof. The controller 130 may include an error correcting code (ECC) engine 132 and an interface 154 (e.g., a host interface). The ECC engine 132 may include one or more encoders (e.g., an encoder 134) and one or more decoders (e.g., a decoder 136). In an illustrative implementation, the encoder 134 includes a low-density parity check (LDPC) encoder, and the decoder 136 includes an LDPC decoder. Alternatively or in addition, the ECC engine 132 may include one or more other encoders or decoders, such as an encoder or decoder configured to operate according to a Hamming scheme, a Reed-Solomon (RS) scheme, a Bose-Chaudhuri-Hocquenghem (BCH) scheme, a turbo scheme, one or more other ECC schemes, or a combination thereof.

In some implementations in accordance with the disclosure, the ECC engine 132 may store (or may be configured to access) information 135 indicating one or more structures (e.g., one or more bundles of physically neighboring storage elements that may be referred to for example as "bit lines", "columns", "fingers", "combs", "vertical bit lines" ("VBL"s), or any other structure, or a combination thereof) of the memory array 104. The information 135 may indicate one or more "bad" structures, such as one or more structures having a defect (e.g., a break). For example, the ECC engine 132 may be configured to identify a defect in a structure based on a threshold number of errors in data sensed from a storage element coupled to the structure.

The decoder 136 includes a CSB-based log-likelihood ratio (LLR) generator 138, a first set of nodes (e.g., a set of variable nodes 148), and a second set of nodes (e.g., a set of check nodes 152). The CSB-based LLR generator 138 includes a third set of nodes 140. The third set of nodes is coupled to the set of variable nodes 148, and the set of variable nodes 148 is coupled to the set of check nodes 152. The decoder 136 may function as a three-stage decoder, such as a tripartite decoder that operates based on a three stage (or tripartite) graph that represents an LDPC scheme.

During operation, the controller 130 is configured to receive data and instructions from the accessing device 160 using the interface 154. For example, the controller 130 may receive data 162 from the accessing device 160 via the interface 154. The controller 130 may receive a request for write access to the memory array 104 from the accessing device 160 with the data 162.

The ECC engine 132 may be configured to receive the data 162. The ECC engine 132 may be configured to initiate an encoding process using the data 162 in response to the request for write access, such as by inputting the data 162 to the encoder 134 to generate the data 108 (e.g., one or more ECC codewords based on the data 162). The controller 130 may send the data 108 to the memory device 103, and the memory device 103 may store the data 108 at the memory array 104.

The controller 130 may send a read command 120 to the memory device 103 to cause the read/write circuitry 110 to sense the data 108. For example, the controller 130 may send the read command 120 to the memory device 103 in response to receiving a request for read access from the accessing device 160.

In response to receiving the read command 120, the memory device 103 may sense the storage region 106 (e.g., using the read/write circuitry 110) to generate one or more sets of bits, such as a set of hard bits 172 representing the data 108 and a first set of soft bits 174. The first set of soft bits 174 may indicate reliability information useable by the decoder 136 during decoding of the set of hard bits 172.

Figure 1B:
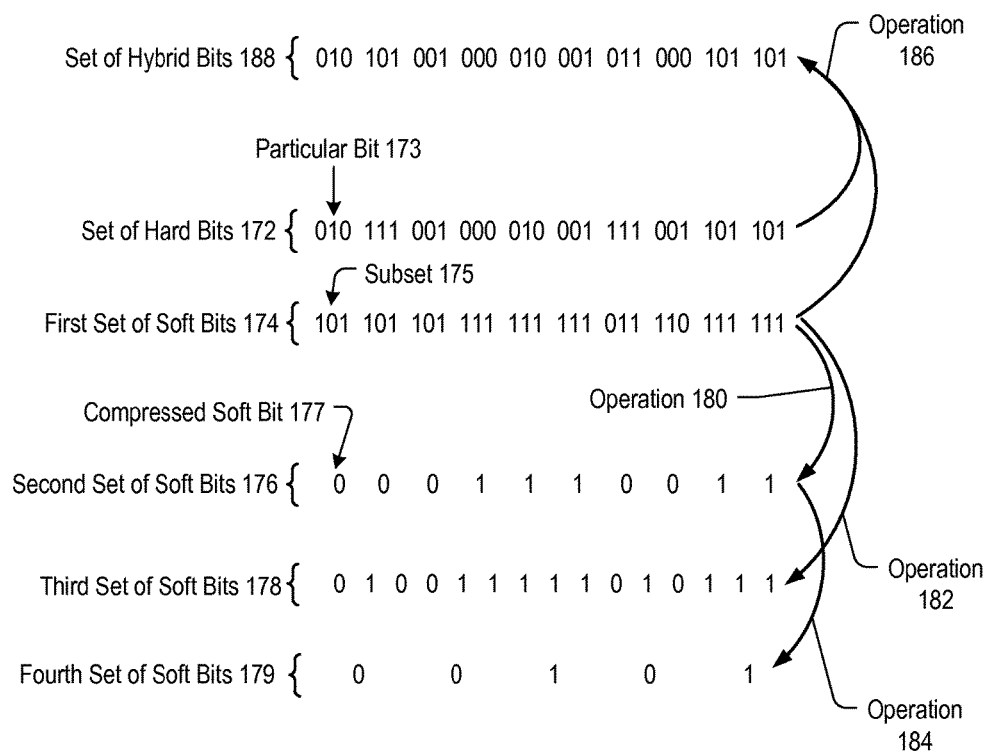
FIG. 1B is a diagram illustrating certain aspects of an example of a data storage device, such as the data storage device of FIG. 1A.
Figure 1B:
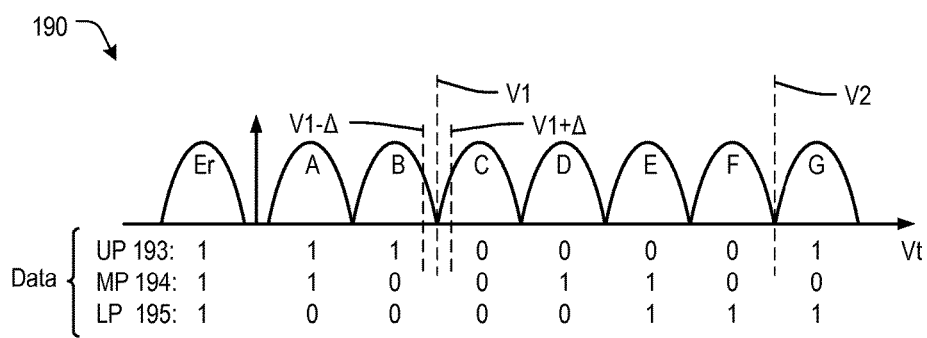

To further illustrate, FIG. 1B depicts an illustrative data storage scheme 190, which represents an illustrative mapping of the data 108 (an upper page 193, a middle page 194, and a lower page 195) to states (an erase ("Er") state, an "A" state, a "B" state, a "C" state, a "D" state, an "E" state, an "F" state, and a "G" state). It should be appreciated that although the data storage scheme 190 depicts a three-bit-per cell scheme for illustration, in other cases the data 108 may be stored using a one-bit-per-cell data storage scheme, a two-bit-per-cell data storage scheme, a four-bit-per-cell data storage scheme, or another number of bits per cell. Further, the data 108 may be stored using one or more other logical pages alternatively or in addition to the pages 193-195 (e.g., using a fourth logical page in addition to the pages 193-195, such as in connection with a four-bits-per-cell data storage scheme).

The set of hard bits 172 may represent the pages 193-195, one or more other logical pages, or a combination thereof. The first set of soft bits 174 may represent the pages 193-195, one or more other logical pages, or a combination thereof. The first set of soft bits 174 may include soft bits representing a single logical page (e.g., one of the pages 193-195, or another logical page) using an "intra-page" technique. In this example, the operation 180 may correspond to an intra-page compression operation. Alternatively, the first set of soft bits 174 may include soft bits representing multiple logical pages using an "inter-page" technique. In this example, the multiple pages may be stored at a single storage region (e.g., the storage region 106) or at multiple storage regions (e.g., the storage regions 106, 109), and the operation 180 may correspond to an inter-page compression operation.

In the example of FIG. 1B, the upper page 193 may be sensed using a first threshold voltage (V1) and using a second threshold voltage (V2) to generate hard bits, such as the set of hard bits 172. The upper page 193 may be sensed using one or more other threshold voltages to generate one or more soft bits, such as the first set of soft bits 174. For example, FIG. 1B illustrates that the upper page 193 may be sensed using a third threshold voltage (V1−Δ) and using a fourth threshold voltage (V1+Δ), where the delta value Δ indicates a difference between a hard bit sensing threshold and a soft bit sensing threshold.

In some applications, the memory device 103 may be configured to perform a particular read process that reduces a number of sensing operations used to generate the set of hard bits 172 and the first set of soft bits 174 as compared to the foregoing illustration described with reference to the data storage scheme 190 of FIG. 1B. For example, the memory device 103 may sense the storage region 106 using a multi-state sensing technique (e.g., by concurrently sensing multiple storage element threshold voltages at the storage region 106), a ramp sensing technique (e.g., by "ramping" a read voltage (to increase the read threshold in a continuous manner) at the storage region 106 and by checking at predetermined time steps whether the memory element is conducting), or another sensing technique. In some implementations, a non-ramp sensing technique may be used at the storage region 106, such as by applying a sequence of different read voltages to storage elements of the storage region 106 (instead of using a ramping a read voltage).

In an illustrative implementation, a ramp sensing process is used to reduce a number of operations performed during a read process (or to reduce the overall duration of the read process) to generate the set of hard bits 172 and the first set of soft bits 174. The ramp sensing process may be used to generate the set of hard bits 172 concurrently with generating the first set of soft bits 174. To illustrate, the memory device 103 may include a digital counter. The digital counter may be configured to store a digital value (a set of bits) that is incremented during the ramp sensing process as a read voltage is increased. The digital value may include one or more most significant bits (MSBs) indicating one or more hard bits and may further include one or more least significant bits (LSBs) indicating one or more soft bits. It should be appreciated that the foregoing example is provided for illustration and that one or more other read processes may be used at the memory device 103.

Referring again to FIG. 1A, the CSB circuitry 118 may be configured to perform an operation using the first set of soft bits 174 to generate a second set of soft bits 176. In an illustrative implementation, the CSB circuitry 118 includes one or more AND logic gates configured to compress the first set of soft bits 174 to generate the second set of soft bits 176 in accordance with a lossy compression scheme. For example, the CSB circuitry 118 may perform an operation to compress the first set of soft bits 174 based on a compression rate r, where r indicates a ratio of a first number of bits (also referred to herein as a first bit count) of the first set of soft bits 174 to a second number of bits (also referred to herein as a second bit count) of the second set of soft bits 176. The operation may include a bitwise operation, such as a bitwise AND operation, a bitwise OR operation, or another bitwise operation.

To illustrate, if r is equal to two, then the CSB circuitry 118 may perform an AND operation using every two bits of the first set of soft bits 174 to generate the second set of soft bits 176 (where the second bit count is one half the first bit count). As another example, if r is equal to three, then the CSB circuitry 118 may perform an AND operation using every three bits of the first set of soft bits 174 to generate the second set of soft bits 176 (where the second bit count is one third the first bit count). In other implementations, another operation may be used to generate the second set of soft bits 176, such as a bitwise OR operation, as an illustrative example.

To further illustrate, FIG. 1B depicts illustrative examples of the set of hard bits 172, the first set of soft bits 174, and the second set of soft bits 176. FIG. 1B illustrates that an operation 180 (e.g., a bitwise AND operation) may be performed using the first set of soft bits 174 to generate the second set of soft bits 176. In the example of FIG. 1B, the operation 180 is performed based on r=3 (e.g., where each group of three soft bits of the first set of soft bits 174 is "compressed" into a particular soft bit of the second set of soft bits 176). As a particular example, a compressed soft bit 177 may be generated based on a subset 175 of the first set of soft bits 174. In this example, a value of the compressed soft bit 177 ("0") indicates that a bitwise AND operation performed using the subset 175 results in "0" (i.e., "1" AND "0" AND "1" results in a "0" value).

Referring again to FIG. 1A, the memory device 103 may have a particular configuration based on a particular application. To illustrate, in a first example, the CSB circuitry 118 is coupled to the read/write circuitry 110 and to one or more of the latches 112-116. In this example, the CSB circuitry 118 is configured to receive the first set of soft bits 174 from the read/write circuitry 110 and to provide the second set of soft bits 176 to one or more of the latches 112-116 based on the first set of soft bits 174.

In a second example, the CSB circuitry 118 is coupled to one or more of the latches 112-116 and to a connection between the memory device 103 and the controller 130 (e.g., the memory-to-controller bus 126). In this example, the CSB circuitry 118 may be configured to receive the first set of soft bits 174 from one of the latches 112-116 and to provide the second set of soft bits 176 to the controller 130 using the memory-to-controller bus 126.

In a third example, soft bit operations may be performed at the latches 112-116. In this example, soft bit compression may be enabled using latch-based commands from the controller 130 (e.g., by using commands that cause the memory device 103 to perform logical operations at the latches 112-116, such as AND operations, OR operations, or other logical operations). Depending on the particular application, the CSB circuitry 118 may be omitted from the memory device 103 by not including the CSB circuitry 118 in the memory device 103 (and the latches 112-116 may be used to perform operations described with reference to the CSB circuitry 118, such as a bitwise AND operation), or the CSB circuitry 118 may be coupled between the latches 112-116 (e.g., one or more AND gates may be coupled between the latches 112, 114 and between the latches 114, 116).

In some applications, the CSB circuitry 118 may be configured to access information indicating one or more "bad" structures of the memory array 104 (such as the information 135, which may be stored at the memory array 104 in some implementations). The CSB circuitry 118 may be configured to exclude one or more soft bits of the first set of soft bits 174 from an operation that generates the second set of soft bits 176 if the one or more soft bits are sensed from one or more storage elements coupled to the one or more structures.

To further illustrate, referring again to FIG. 1B, if the second bit of the subset 175 ("0") is sensed from a storage element coupled to a particular structure (e.g., a structure identified by the information 135 as a "bad" structure), the second bit of the subset 175 may be excluded from the operation 180. If the second bit is excluded from the operation 180, a value of the compressed soft bit 177 may be "1" (i.e., "1" AND "1" results in a "1" value).

In some implementations that use multiple bits per cell, a subset of soft bits may correspond to a particular storage element of the memory array 104. For example, each bit of the subset 175 may be sensed from a particular storage element of the memory array 104, such as if each bit of the subset 175 is included in a respective page of the pages 193-195. In this case, each bit of the subset 175 may have a common bit position and may be stored in a common storage element (a single storage element) of the memory array 104. To illustrate, a first bit of the subset 175 may be stored at the common storage element using one of the upper page 193, the middle page 194, or the lower page 195, a second bit of the subset 175 may be stored at the common storage element using another of the upper page 193, the middle page 194, or the lower page 195, and a third bit of the subset 175 may be stored at the common storage element using the other of the upper page 193, the middle page 194, or the lower page 195). Thus, the first set of soft bits 174 may include multiple soft bits sensed from a single storage element of the storage region 106.

Alternatively or in addition, the first set of soft bits 174 may include one or more soft bits sensed from the storage region 106 and may also include one or more soft bits sensed from another region, such as a neighbor region of the storage region 106 or from a non-neighbor region of the storage region 106. For example, the first set of soft bits 174 may include one or more soft bits sensed from the storage region 109, which may correspond to a "neighbor" region of the storage region 106 (e.g., an adjacent storage region). Sensing one or more soft bits from a neighbor region may enable detection of one or more errors due to a cross-coupling or disturb effect (e.g., a write disturb effect) at the storage region 106. As a particular non-limiting illustrative example, the first bit of the subset 175 may be sensed from a particular storage element of the storage region 106, the second bit of the subset 175 may be sensed from a corresponding storage element of the storage region 109, and the third bit of the subset 175 may be sensed from the particular storage element of the storage region 106, from the corresponding storage element of the storage region 109, or from a corresponding storage element of another storage region (e.g., another neighbor region of the storage region 106).

The CSB circuitry 118 may be configured to select the bits of the subset 175 for a bitwise operation. In an illustrative example, the compression rate r may be equal to a number of bits stored per cell. In the example of the operation 180 and the data storage scheme 190, the compression rate r and the number of bits stored per cell are equal to three. In other cases, the compression rate r and/or the number of bits stored per cell may be another number. In a particular illustrative example, a sensing process (e.g., a ramp sensing process) may generate three sets of soft bits corresponding to each of the pages 193-195 (e.g., the first set of soft bits 174), and the three sets of soft bits may be stored at the latches 112-116. A latch-based operation (e.g., a bitwise AND operation, which may be initiated by the controller 130) may be performed to compress the three sets of soft bits into a single set of soft bits (e.g., the second set of soft bits 176).

Referring again to FIG. 1A, depending on the particular implementation, the compression rate r may be a "default" rate implemented by the CSB circuitry 118. Alternatively or in addition, the controller 130 may provide an indication (e.g., an indication 122) that specifies the compression rate r to the memory device 103. The indication 122 may specify one or more of the compression rate r, a number of soft bits per storage element to be generated while sensing data, or one or more delta values (e.g., the delta value Δ, which may be expressed as a function of the compression rate r). For example, although the data storage scheme 190 of FIG. 1B indicates sensing two soft bits per storage element using the third threshold voltage (V1−Δ) and the fourth threshold voltage (V1+Δ), in other cases, a different number of soft bits may be generated per storage element (e.g., four soft bits per storage element, such as using a fifth threshold voltage (V1+2Δ) and a sixth threshold voltage (V1−2Δ), as an illustrative example). The controller 130 may provide the indication 122 to the memory device 103 with the read command 120 or in connection with another command.

The controller 130 may receive the set of hard bits 172 and the second set of soft bits 176 from the CSB circuitry 118. The controller 130 may input the set of hard bits 172 and the second set of soft bits 176 to the decoder 136 to initiate a decoding process that decodes the set of hard bits 172 using the second set of soft bits 176. For example, the CSB-based LLR generator 138 may generate a first set of LLR values 141 based on the set of hard bits 172 and the second set of soft bits 176. The first set of LLR values 141 may indicate reliabilities associated with the set of hard bits 172. For example, a particular value of the first set of LLR values 141 may indicate a likelihood that a bit of the set of hard bits 172 has a logic "0" value (e.g., if the particular value is positive) or a logic "1" value (e.g., if the particular value is negative).

In a particular example of a decoding process, the first set of LLR values 141 is generated as a function of a value of the compression ratio r. For example, the first set of LLR values 141 may indicate an expected error probability for each hard bit of the set of hard bits 172 having a corresponding soft bit of the second set of soft bits 176 that has a logic "0" value, where each expected error probability is determined according to:

$$\sum\nolimits_{j=1}^{j=r} \binom{r}{j}(\alpha^j)(1-\alpha)^{r-j}\left(\frac{(r-j)(p_L)+jp_H}{r}\right)$$

In this example, $P_H$ indicates a reliability (e.g., an expected error probability) associated with a hard bit of the set of hard bits 172 having a corresponding compressed soft bit of the second set of soft bits 176 that has a logic "0" value, $P_L$ indicates a reliability (e.g., an expected error probability) associated with a hard bit of the set of hard bits 172 having a corresponding compressed soft bit of the second set of soft bits 176 that has a logic "1" value, and $P_L < P_H$.

Further, α indicates a fraction of unreliable hard bits of the set of hard bits 172 to reliable hard bits of the set of hard bits 172.

In this example, a decoding process may use a bipartite decoding technique. In another implementation, a decoding process may use a tripartite decoding technique. In connection with a tripartite decoding technique, the CSB-based LLR generator 138 may be configured to generate the first set of LLR values 141 according to:

$$P_{sv} = \begin{cases} \log 2 \frac{1-P_L}{P_L} * \text{sign}(HBv) & CSB = 1 \\ \log 2 \frac{1-P_A}{P_A} * \text{sign}(HBv) & CSB = 0 \end{cases}$$

$$\text{sign}(HBv) \in \{-1, 1\}$$

In this example, $P_{sv}$ indicates the first set of LLR values 141, $P_L$ indicates a bit error rate (BER) associated with storage elements associated with a soft bit equal to one, HBV indicates a hard bit of the set of hard bits 172, CSB indicates a compressed soft bit of the second set of soft bits 176, and $P_A$ is determined based on:

$$P_A = q * P_H + (1-q) * P_L$$

$$q = Pr(SBv = 0 \mid CSBs = 0, HBv', Qv's : v' \in N(s)\backslash v)$$
$$= \frac{Pr(SBv = 0, CSBs = 0, HBv', Qv's)}{Pr(CSBs = 0, HBv', Qv's)}$$
$$= \frac{Pr(CSBs = 0 \mid SBv = 0, HBv', QV's) * Pr(SBv = 0 \mid HBv', QV's)) * Pr(HBv', QV's)}{Pr(CSBs = 0, HBv', Qv's) * Pr(HBv', Qv's)}$$
$$= \frac{1 * \alpha}{Pr(CSBs = 0 \mid HBv', Qv's)}$$

$$\beta = Pr(CSBs = 1 \mid HBv', Qv's)$$
$$= Pr(SBv = 1 \mid HBv', Qv's) * \prod_{v' \in N(s)\backslash v} Pr(SBv' = 1 \mid HBv', Qv's)$$
$$= (1-\alpha) * \prod_{v' \in N(s)\backslash v} \gamma'_{v'}$$

$$\gamma'_{v'} = Pr(SBv' = 1 \mid HBv', Qv's) =$$
$$Pr(SBv' = 1, v' \text{erroneous} \mid HBv', Qv's) + Pr(SBv' = 1, v' \text{correct} \mid HBv',$$
$$Qv's) = Pr(SBv' = 1, V' \text{erroneous} \mid HBv', Qv's) *$$
$$Pr(v' \text{erroneous} \mid HBv', Qv's) +$$
$$Pr(SBv' = 1, v' \text{correct} \mid HBv', Qv's) * Pr(v' \text{correct} \mid HBv', Qv's) =$$
$$Pr(v' \text{erroneous} \mid SBv' = 1) *$$
$$\frac{Pr(SB_{v'} = 1) * Pr(V' \text{erroneous} \mid HBv', Qv's)}{Pr(v' \text{erroneous})} +$$
$$\frac{Pr(v' \text{correct} \mid SB_{v'} = 1) * Pr(SB_{v'} = 1)}{Pr(v' \text{correct})} *$$

$$Pr(v' \text{correct} \mid HBv', Qv's) = \frac{P_L(1-\alpha)}{P_L(1-\alpha) + P_H\alpha} * \frac{(2Q_{v's})^{HBv'}}{1 + 2^{Qv's}} +$$
$$\frac{(1-P_L)(1-\alpha)}{(1-P_L)(1-\alpha) + (1-P_H)\alpha} * \frac{(2Q_{v's})^{(1-HBv')}}{1 + 2^{Qv's}}$$

$$Q_{v's} = \log_2 \frac{Pr(v' = 0 \mid \sum R_{cv'})}{Pr(v' = 1 \mid \sum R_{cv'})}$$
$$= > Pr\left(v' = 0 \mid \sum_{c \in N(v')} R_{cv'}\right) = \frac{2Q_{v's}}{1 + 2Q_{v's}}$$
$$= > P_A = \frac{\alpha}{1 - (1-\alpha) * \prod_{v' \in N(v')}(z)}$$

$$z \triangleq \left(\frac{(1-P_L)(1-\alpha) * (2Q_{v's})^{(1-HBv')}}{[(1-P_L)(1-\alpha) + (1-P_H)\alpha](1 + 2^{v's})} + \frac{P_L(1-\alpha) * (2Q_{v's})^{HBv'}}{(P_L(1-\alpha) + P_H * \alpha) * (1 + 2^{Qv's})}\right)$$

The set of variable nodes 148 may generate a second set of LLR values 142 based in part on the first set of LLR values 141. For example, the set of variable nodes 148 may perform variable node processing specified by a parity check matrix, such as an LDPC parity check matrix, to generate the second set of LLR values 142. The set of variable nodes 148 may be configured to perform computations in accordance with a set of parity equations specified by a set of columns of the LDPC parity check matrix to generate the second set of LLR values 142. The set of variable nodes 148 may provide the second set of LLR values 142 to the set of check nodes 152 (e.g., using a variable-to-check message). In an illustrative implementation, the set of variable nodes 148 may be configured to generate the second set of LLR values 142 according to:

$$Q_{vc} = P_{SV} + \sum_{c' \in N(v) \setminus c} R_{c'v}$$

In this example, $Q_{vc}$ corresponds to the second set of LLR values 142. The set of check nodes 152 may generate a third set of LLR values 143 based in part on the second set of LLR values 142. For example, the set of check nodes 152 may perform check node processing in accordance with a parity check matrix, such as an LDPC parity check matrix, to generate the third set of LLR values 143 based on the second set of LLR values 142. The set of check nodes 152 may be configured to perform computations in accordance with a set of parity equations specified by a set of rows of an LDPC parity check matrix to generate the third set of LLR values 143. The set of check nodes 152 may provide the third set of LLR values 143 to the set of variable nodes 148 (e.g., using a check-to-variable message). In an illustrative implementation, the set of variable nodes 148 may be configured to generate the third set of LLR values 143 according to:

$$R_{cv} = \oplus (Q_{v'c}) : v' \in N(c) \setminus v$$

In this example, $R_{cv}$ corresponds to the third set of LLR values 143, and ⊕ indicates a soft exclusive-or (XOR) operation. The set of variable nodes 148 may generate a fourth set of LLR values 144 based in part on the second set of LLR values 142. For example, the set of check nodes 152 may perform check node processing in accordance with a parity check matrix, such as an LDPC parity check matrix, to generate the fourth set of LLR values 144 based on the third set of LLR values 143. The set of variable nodes 148 may provide the fourth set of LLR values 144 to the third set of nodes 140. In an illustrative implementation, the set of variable nodes 148 may be configured to generate the fourth set of LLR values 144 according to:

$$Q_{vs} = \sum_{c \in N(v)} R_{cv}$$

The CSB-based LLR generator 138 may be configured to receive the fourth set of LLR values 144 from the set of variable nodes 148. The CSB-based LLR generator 138 may generate "updated" reliability information based in part on the fourth set of LLR values 144. For example, the CSB-based LLR generator 138 may generate a fifth set of LLR values (e.g., an updated version of the first set of LLR values 141). To generate the fifth set of LLR values, the CSB-based LLR generator 138 may be configured to update a particular value of the first set of LLR values 141 based on a hard bit value corresponding to a particular variable node of the set of variable nodes 148, based on a particular compressed soft bit value (e.g., the compressed soft bit 177 of FIG. 1B, as an illustrative example), and based on one or more values generated by a particular group (e.g., a subset) of the set of variable nodes 148 corresponding to the compressed soft bit value, as described further with reference to FIG. 2.

The CSB-based LLR generator 138 be configured to provide the fifth set of LLR values to the set of variable nodes 148. In some implementations, the first set of LLR values 141 and the fourth set of LLR values 144 may be updated only once during multiple decoding iterations of a decoding process. In this case, the second set of LLR values 142 and the third set of LLR values 143 may be updated more frequently than the first set of LLR values 141 and the fourth set of LLR values 144. In other implementations, the first set of LLR values 141 and the fourth set of LLR values 144 may be updated each decoding iteration of a decoding process.

The set of variable nodes 148 may perform variable node processing based on the fifth set of LLR values to generate a sixth set of LLR values (e.g., an updated version of the second set of LLR values 142). The set of variable nodes 148 may provide the sixth set of LLR values to the set of check nodes 152. Operation of the decoder 136 may continue until either the decoding operation converges to generate a valid codeword (e.g., by generating sets of LLR values and by updating bit values of the set of hard bits 172 based on the sets of LLR values until the set of hard bits 172 satisfies parity conditions indicated by an LDPC parity check matrix) or the decoding operation "times out" without converging to generate a valid codeword.

In some cases, if the decoding operation does not converge to generate a valid codeword, the controller 130 may request additional information from the memory device 103 (e.g., to facilitate a retry of the decoding operation). For example, the controller 130 may send the message 124 to the memory device 103, and the message 124 may indicate that the memory device 103 is to generate another set of soft bits using another value of the compression rater, such as by generating a third set of soft bits 178 using r=2. The third set of soft bits has a third number of bits (also referred to herein as a third bit count) that is less than the first bit count of the first set of soft bits 174.

In some implementations, the message 124 may indicate a value of the compression rate r (e.g., r=3, r=2, or another compression ratio (including the trivial scenario of r=1→where no compression is done). For example, in some cases, the message 124 may include the indication 122. In other implementations, the message 124 may not indicate a value of the compression rate r. For example, the CSB circuitry 118 may be configured to decrement the value of the compression rate r (e.g., from r=3 to r=2 or from r=2 to r=1 in response to receiving the message 124, as illustrative examples). In some implementations, the compression rate r may have a non-integer value. For example, if the first set of soft bits 174 includes groups of three soft bits that are compressed to generate compressed soft bits (as described with reference to the operation 180, where r=3) and further includes groups (that includes the same number of memory elements in this example) of two soft bits that are compressed to generate compressed soft bits, then a value of the compression rate r may be equal to 2.5.

Alternatively, the compression ratio may be set to any other value (for r>1). For example, the compression ratio may be set according to the relation of group sizes with different compression ratio ("r") values (such as if soft bits are to be sensed from multiple storage regions each associated with a corresponding compression ratio and if the value of r is based on an average of the compression ratios associated with the multiple storage regions). In some implementations, r may be increased if a relatively large number of storage elements are to be sensed during a sensing process or if a relative large number of soft bits are to be generated using the sensing process in order to decrease an amount of information transferred from the memory device 103 to the controller 130.

To further illustrate, referring again to FIG. 1B, the CSB circuitry 118 of FIG. 1A may perform an operation 182 to generate the third set of soft bits 178 based on the first set of soft bits 174. For example, a bitwise AND operation may be performed using bits one and two ("1" and "0") of the first set of soft bits 174 to generate bit one ("0") of the third set of soft bits. As another example, a bitwise AND operation may be performed using bits three and four ("1" and "1") of the first set of soft bits 174 to generate bit two ("1") of the third set of soft bits 178. Depending on the particular implementation, the first set of soft bits 174 may be re-sensed in response to receiving the message 124, or the first set of soft bits 174 may be accessed from one of the latches 112-116 (e.g., if the first set of soft bits 174 has not been overwritten at one of the latches 112-116).

Thus, an operation (e.g., the operation 180 or the operation 182) may include generating compressed soft bits (e.g., the second set of soft bits 176 or the third set of soft bits 178) based on a set of uncompressed soft bits (e.g., the first set of soft bits 174). Alternatively or in addition, an operation may be performed that includes generating a set of compressed soft bits based on a set of compressed soft bits. To illustrate, FIG. 1B depicts that an operation 184 may be performed based on the second set of soft bits 174. In the example of the operation 184, subsets of the second set of soft bits 174 ("00," "01," "11," "01," and "11") may be compressed to generate a fourth set of soft bits 179 ("0," "0," "1," "0," and "1"). In this example, r=2. It should be appreciated that in other examples r may have a different value and/or an operation may be performed using a different set of compressed soft bits (e.g., using the third set of soft bits 178, as an illustrative example).

Alternatively or in addition, a compression operation may be performed using one or more sets of hard bits (e.g., the set of hard bits 172) with one or more sets of (compressed or uncompressed) soft bits, such as any of the sets of soft bits 174, 176, and 178. As an example, the set of hard bits 172 and the first set of soft bits 174 may be compressed (e.g., using an AND operation) using an operation 186 to generate a set of "hybrid" bits 188. In this example, an operation may include compressing one or more hard bits of the set of hard bits 172 with one or more soft bits of the first set of soft bits 174 to generate one or more bits of the set of hybrid bits 188.

Referring again to FIG. 1A, the controller 130 may input the third set of soft bits 178 to the decoder 136 to initiate another decoding operation to decode the set of hard bits 172. Decoding using the third set of soft bits 178 may be performed as described with reference to decoding using the second set of soft bits 176. Operation of the decoder 136 may continue until either the decoding operation converges to generate a valid codeword (e.g., by generating sets of LLR values until parity conditions indicated by an LDPC parity check matrix are satisfied) or the decoding operation "times out" without converging to generate a valid codeword. In some cases, the controller 130 may request the "full" set of soft bits from the memory device 103 (e.g., by requesting the first set of soft bits 174 in response to a decoding failure).

In some implementations, the CSB-based LLR generator 138 is configured to access the information 135 to identify data sensed from one or more "bad" structures. To illustrate, if a particular bit 173 of the set of hard bits 172 is sensed from a "bad" structure identified by the information 135, the CSB-based LLR generator 138 may "override" one or more corresponding compressed soft bits of the second set of soft bits 176 to indicate low reliability of the particular bit 173, such as by "forcing" the value of the compressed soft bit 177 of FIG. 1B to be zero (or another value indicating low reliability).

Depending on the particular implementation, uncompressed soft bits and/or compressed soft bits may be generated either automatically or "as needed." For example, the second set of soft bits 176 may be generated at the memory device 103 automatically in response to the command 120. In another example, the controller 130 may perform a decoding process using the set of hard bits 172 (or using the set of hard bits 172 and the first set of soft bits 174) prior to requesting the second set of soft bits 176, the third set of soft bits 178, and/or the fourth set of soft bits 179 (e.g., by sending another command to the memory device 103). In this example, the controller 130 may request any of the second set of soft bits 176, the third set of soft bits 178, the fourth set of soft bits 179, and/or the set of hybrid bits 188 (or another set of bits) based on a decoding failure of the decoding process using any of the set of hard bits 172, the first set of soft bits 174, the second set of soft bits 176, the third set of soft bits 178, the fourth set of soft bits 179, the set of hybrid bits 188, or another set of soft bits. Alternatively or in addition, the controller 130 may request any of the second set of soft bits 176, the third set of soft bits 178, the fourth set of soft bits 179, and/or the set of hybrid bits 188 (or another set of soft bits) based on another indication (e.g., a BER or estimated BER of data exceeding a threshold BER or a duration of the decoding process exceeding a threshold duration).

In an illustrative implementation, the set of hard bits 172 represents multiple logical pages (e.g., two or more of the pages 193-195 and/or one or more other logical pages), the first set of soft bits 174 represents a subset of the multiple logical pages (e.g., one logical page), and a non-compressed representation of a particular logical page of the multiple logical pages is provided to the controller 130 to decode the set of hard bits 172. The particular logical page may be associated with a higher BER as compared to each of the other multiple logical pages. To illustrate, in the example of the data storage scheme 190, the middle page 194 may be associated with a higher BER as compared to the upper page 193 and the lower page 195 as a result of including more bit transitions between states than the upper page 193 and the lower page 195. In a particular non-limiting example, the set of hard bits 172 may represent each of multiple logical pages (e.g., the pages 193-195), the first set of soft bits 174 may represent a subset of the logical pages (e.g., the upper page 193 and the lower page 195), and an uncompressed representation of the remaining page (e.g., the middle page 194) may be provided to the controller 130 to compensate for the higher BER of the middle page 194. In this example, a first logical page (e.g., the upper page 193) and a second logical page (e.g., the lower page 195) may be compressed without compressing another logical page (e.g., the middle page 194). It should be appreciated that the foregoing example is illustrative. For example, one or more data storage schemes other than the example of the data storage scheme 190 may be used.

The examples described with reference to FIGS. 1A and 1B may improve performance at the data storage device 102. For example, by compressing the first set of soft bits 174 to generate the second set of soft bits 176, less information may be sent from the memory device 103 to the controller 130, reducing congestion at a connection (e.g., the memory-to-controller bus 126) between the memory device 103 and the controller 130. In some cases, compressing the first set of soft bits 174 to generate the second set of soft bits 176 may use one or more clock cycles of a clock signal used by the data storage device 102.

Figure 2:
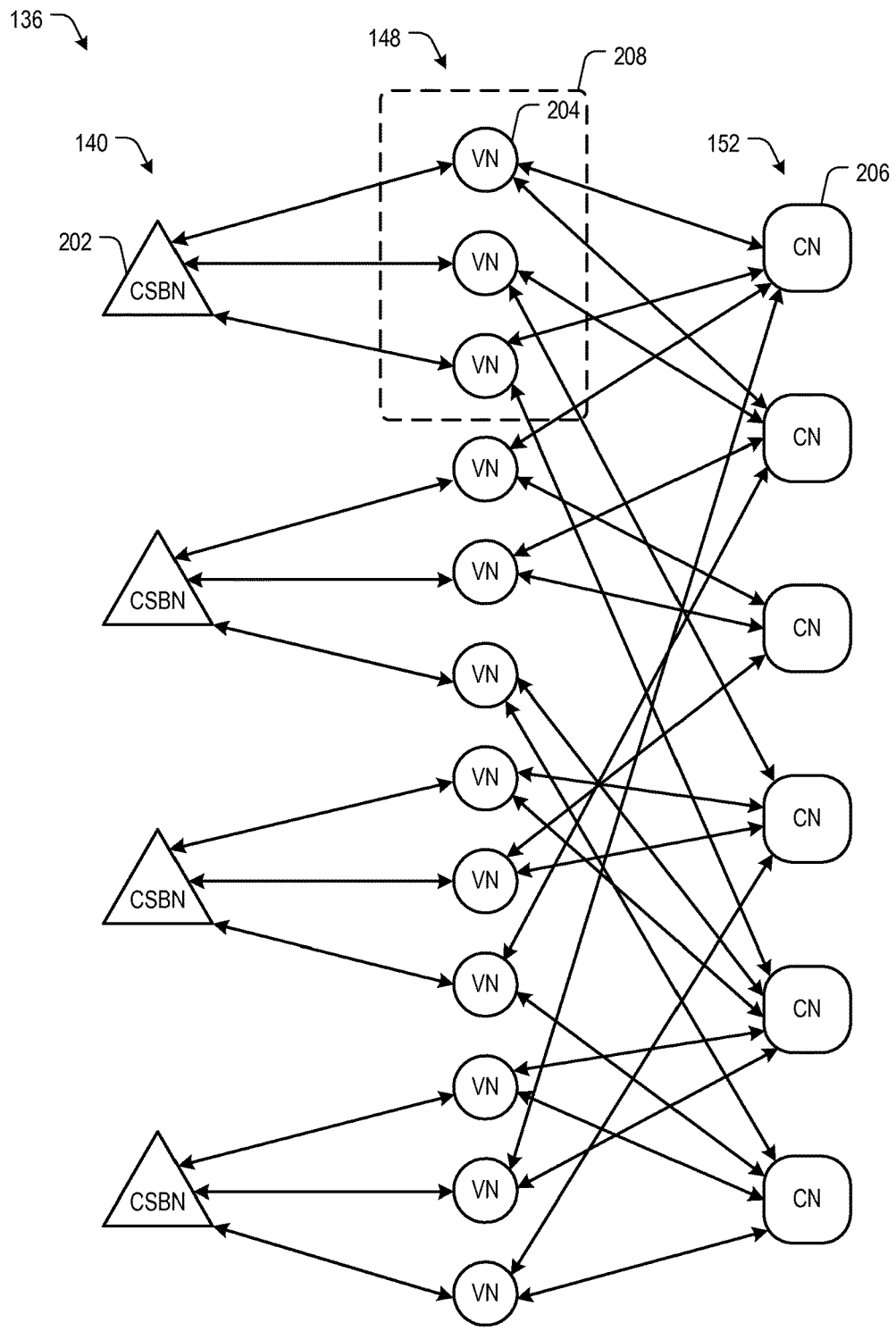
FIG. 2 is a diagram of an illustrative example of decoder that may be included in a data storage device, such as the data storage device of FIG. 1A.

FIG. 2 depicts certain illustrative aspects associated with a decoder, such as the decoder 136 of FIG. 1A. FIG. 2 illustrates that the decoder 136 includes the third set of nodes 140, the set of variable nodes 148, and the set of check nodes 152.

The third set of nodes 140 includes a set of compressed soft bit nodes (CSBNs), such as a representative CSBN 202. Each CSBN of the third set of nodes 140 may be connected to one or more variable nodes (VNs) of the set of variable nodes 148, such as a representative VN 204. Each VN of the set of variable nodes 148 may be connected to one or more check nodes (CNs) of the set of check nodes 152, such as a representative CN 206.

The set of variable nodes 148, the set of check nodes 152, and connections between the set of variable nodes 148 and the set of check nodes 152 may correspond to a parity check matrix, such as an LDPC parity check matrix. For example, a number of VNs included in the set of variable nodes 148 may correspond to a number of columns of the parity check matrix, and a number of CNs included in the set of check nodes 152 may correspond to a number of rows of the parity check matrix. As another example, connections from each VN of the set of variable nodes 148 may correspond to a respective column of the parity check matrix, and connections from each CN of the set of check nodes 152 may correspond to a respective row of the parity check matrix. The set of variable nodes 148 and the set of check nodes 152 may correspond to a two-stage (or bipartite) graph (e.g., a graph representation of parity equations specified by the parity check matrix).

In the example of FIG. 2, each CSBN of the third set of nodes 140 corresponds to a compression rate r=3. For example, each CSBN of FIG. 2 is connected to three VNs of the set of variable nodes 148 (e.g., the CSBN 202 is connected to a group 208 of variable nodes of the set of variable nodes 148). To further illustrate, the third set of nodes 140 may be used in connection with the second set of soft bits 176 (which is generated based on r=3). In other implementations, a different value of the compression ratio r may be used. Components described with reference to the decoder 136 may be implemented using hardware (e.g., logic gates), instructions (e.g., firmware) executable by a processor (e.g., a microcontroller integrated within the controller 130), or a combination thereof.

During operation, the decoder 136 may function according to a belief propagation scheme. For example, each CSBN of the third set of nodes 140 may provide a respective value of the first set of LLR values 141 to one or more VNs of the set of variable nodes 148, and each VN of the set of variable nodes may provide a respective value of the second set of LLR values 142 to one or more CNs of the set of check nodes 152.

Each CN of the set of check nodes 152 may provide a respective value of the third set of LLR values 143 to one or more VNs of the set of variable nodes 148, and each VN of the set of variable nodes 148 may provide a respective value of the fourth set of LLR values 144 to one or more CSBNs of the third set of nodes 140. Each CSBN of the third set of nodes 140 may provide a respective value of a fifth set of LLR values to one or more VNs of the set of variable nodes 148. To generate the fifth set of LLR values, each CSBN of the third set of nodes 140 may be configured to update a particular value of the first set of LLR values 141 of FIG. 1A based on a hard bit value corresponding to a particular variable node of the set of variable nodes 148, based on a particular compressed soft bit value, and based on one or more values generated by a particular group (e.g., a subset) of the set of variable nodes 148 corresponding to the compressed soft bit value.

To illustrate, during an iterative decoding process, the CSBN 202 may be configured to update a particular value of the first set of LLR values 141 based on a hard bit of the set of hard bits 172 corresponding to a particular variable node of the set of variable nodes 148, such as a hard bit corresponding to the VN 204. The CSBN 202 may be further configured to update the particular value of the first set of LLR values 141 based further on a particular compressed soft bit corresponding to the group 208 of variable nodes that includes the VN 204. As an illustrative example, the particular compressed soft bit may correspond to the compressed soft bit 177 of FIG. 1B (and the group 208 of variable nodes may correspond to the subset 175 of the first set of soft bits 174 of FIG. 1B). The CSBN 202 may be further configured to update the particular value of the first set of LLR values 141 based further on a message previously provided by the group 208 (e.g., based on a subset of values of the fourth set of LLR values 144 and/or one or more other values previously provided from the group 208 to the CSBN 202 during the decoding process). Accordingly, a decoding process may include updating LLRs at the third set of nodes 140 based on one or more messages provided by the set of variable nodes 148 during the decoding process.

FIG. 2 illustrates that the decoder 136 may function using a tripartite technique that utilizes three sets of nodes. By using the third set of nodes 140 to update LLR values generated by the set of variable nodes 148 (e.g., by generating a fifth set of LLR values based on the fourth set of LLR values 144), a decoding process may use compressed soft bits while also achieving a high error correction capability (e.g., by utilizing the third set of nodes 140 to update LLR values during multiple iterations of the decoding process instead of using a two-stage decoding process).

Figure 3:
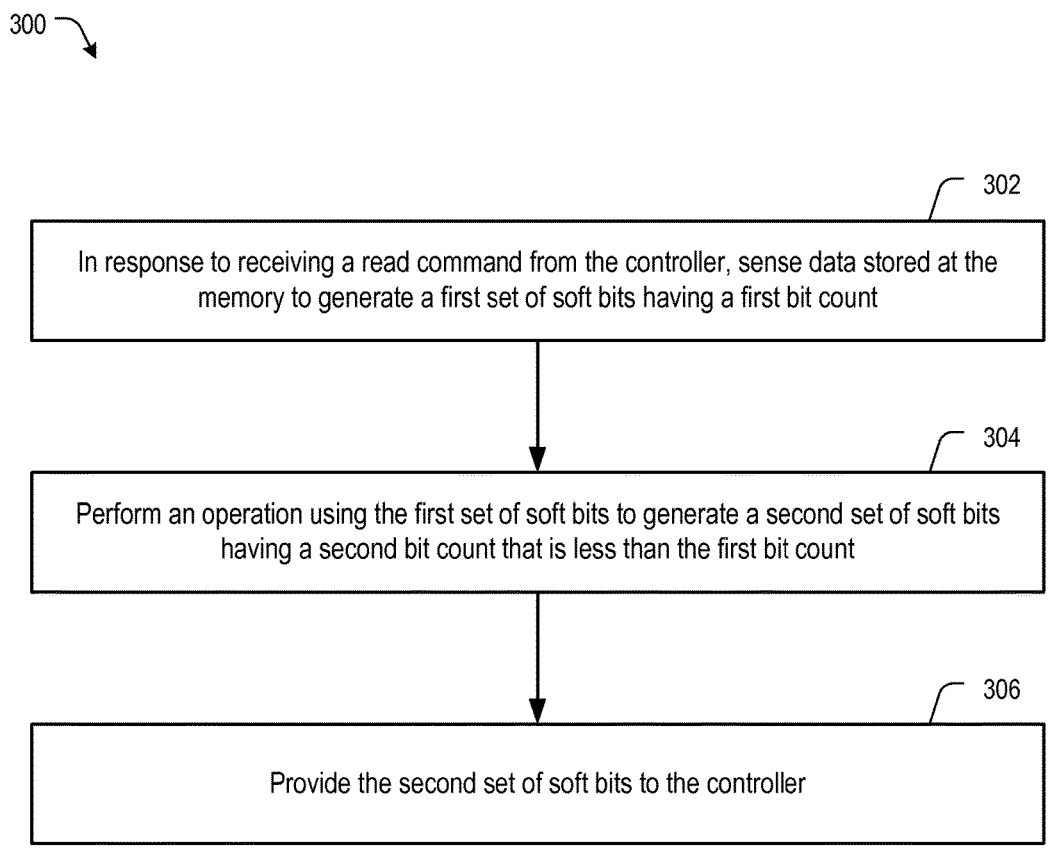
FIG. 3 is a flow diagram of an illustrative example of a method of operation of a data storage device, such as the data storage device of FIG. 1A.

Referring to FIG. 3, a particular illustrative example of a method of operation of a device is depicted and generally designated 300. The method 300 may be performed in a data storage device that includes a controller coupled to a memory device that includes a memory, such as the data storage device 102, the controller 130, the memory device 103, and the memory array 104 of FIG. 1A.

The method 300 includes sensing data stored at the memory to generate a first set of soft bits having a first bit count in response to receiving a read command from the controller, at 302. For example, the data 108 may be sensed by the read/write circuitry 110 in response to the read command 120 to generate the first set of soft bits 174.

The method 300 further includes performing an operation using the first set of soft bits to generate a second set of soft bits having a second bit count that is less than the first bit count, at 304. For example, the CSB circuitry 118 may generate the second set of soft bits 176 based on the first set of soft bits 174, such as by performing a bitwise operation (e.g., a bitwise AND operation, a bitwise OR operation, or another operation) using bits of the first set of soft bits 174. The bitwise operation may correspond to the operation 180. Depending on the particular implementation, the first set of soft bits 174 may be stored at the memory array 104 of FIG. 1A or may be transferred directly into the second set of soft bits 176 using the CSB circuitry 118.

The method 300 further includes providing the second set of soft bits to the controller, at 306. For example, the memory device 103 may provide the second set of soft bits 176 to the controller 130 using any of the latches 112-116.

Compressing the first set of soft bits to generate the second set of soft bits as described with reference to the method 300 of FIG. 3 may reduce an amount of information transferred via a connection, such as the memory-to-controller bus 126 of FIG. 1A. Reducing an amount of information transferred using the connection may increase system bandwidth available for one or more other operations, increasing system throughput and enhancing performance. Further, a particular decoding process may be performed using compressed soft bits. An example of a decoding process that may use compressed soft bits is described with reference to FIG. 4.

Figure 4:
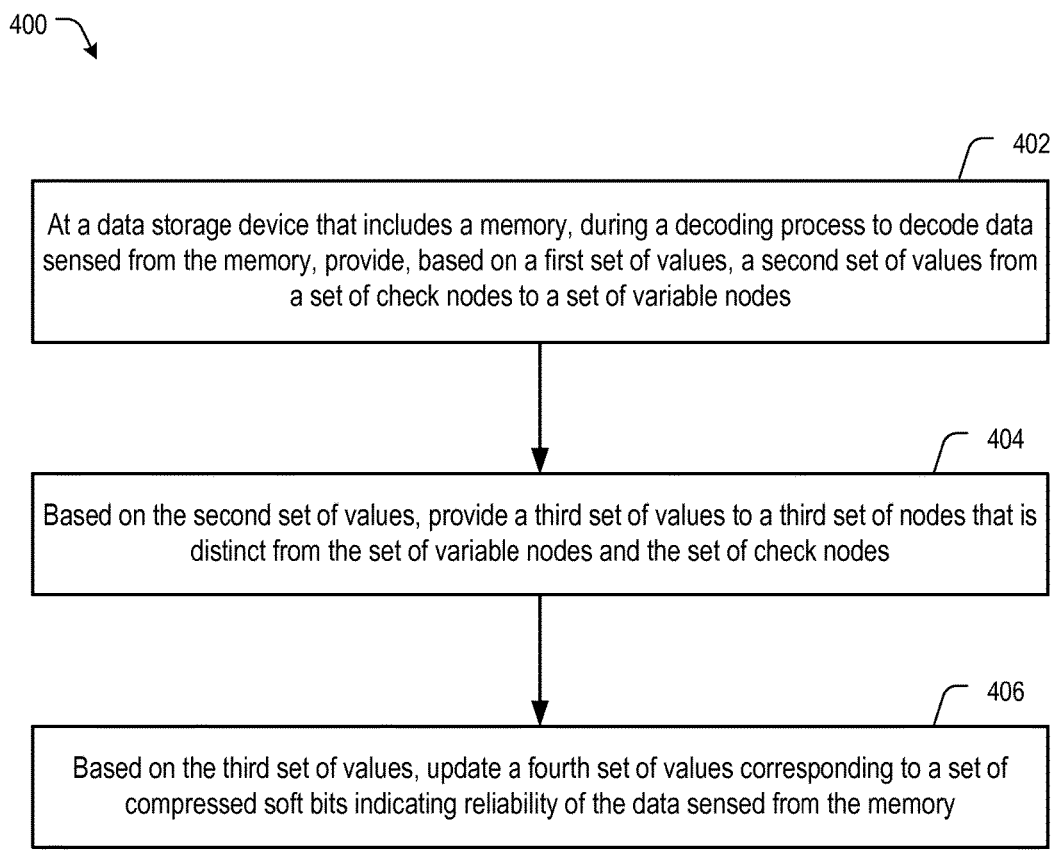
FIG. 4 is a flow diagram of another illustrative example of a method of operation of a data storage device, such as the data storage device of FIG. 1A.

Referring to FIG. 4, a particular illustrative example of a method of operation of a device is depicted and generally designated 400. The method 400 may be performed in a data storage device that includes a controller coupled to a memory device, such as the data storage device 102, the controller 130, and the memory device 103 of FIG. 1A. In an illustrative example, the method 400 is performed in response to performing the method 300 of FIG. 3 (e.g., using the second set of soft bits generated using the method 300 of FIG. 3). The method 400 is performed during a decoding process to decode data sensed from the memory, such as a three-stage decoding process to decode a set of hard bits that represents the data (e.g., a decoding process performed by the decoder 136 to decode the set of hard bits 172).

The method 400 includes providing, based on a first set of values, a second set of values from a set of check nodes to a set of variable nodes, at 402. For example, the set of variable nodes may correspond to the set of variable nodes 148, the set of check nodes may correspond to the set of check nodes 152, the first set of values may correspond to the second set of LLR values 142, and the second set of values may correspond to the third set of LLR values 143.

The method 400 further includes providing a third set of values based on the second set of values to a third set of nodes that is distinct from the set of variable nodes and the set of check nodes, at 404. For example, the third set of nodes may correspond to the third set of nodes 140, and the third set of values may correspond to the fourth set of LLR values 144.

The method 400 further includes updating, based on the third set of values, a fourth set of values corresponding to a set of compressed soft bits indicating reliability of the data sensed from the memory, at 406. For example, the fourth set of values may correspond to the first set of LLR values 141 (which may be generated based on the second set of soft bits 174 and which may indicate reliability of the set of hard bits 172). Depending on the particular implementation, the fourth set of values may be updated once per decoding iteration of the decoding process or once per multiple decoding iterations of the decoding process.

The method 400 may optionally include, prior to providing the first set of values to the set of check nodes, generating the fourth set of values based on the set of compressed soft bits (e.g., generating the first set of LLR values 141 based on the second set of soft bits 176) and providing the fourth set of values to the set of variable nodes to enable the set of variable nodes to generate the first set of values (e.g., to enable the set of variable nodes 148 to generate the second set of LLR values 142).

The examples of FIG. 4 illustrate that a decoder (e.g., the decoder 136) may function using a tripartite technique that utilizes three sets of nodes. By using three sets of nodes, a decoding process may use compressed soft bits while also achieving a high error correction capability (e.g., by utilizing the third set of nodes 140 to update LLR values during multiple iterations of the decoding process instead of using a two-stage decoding process).

Figure 5:
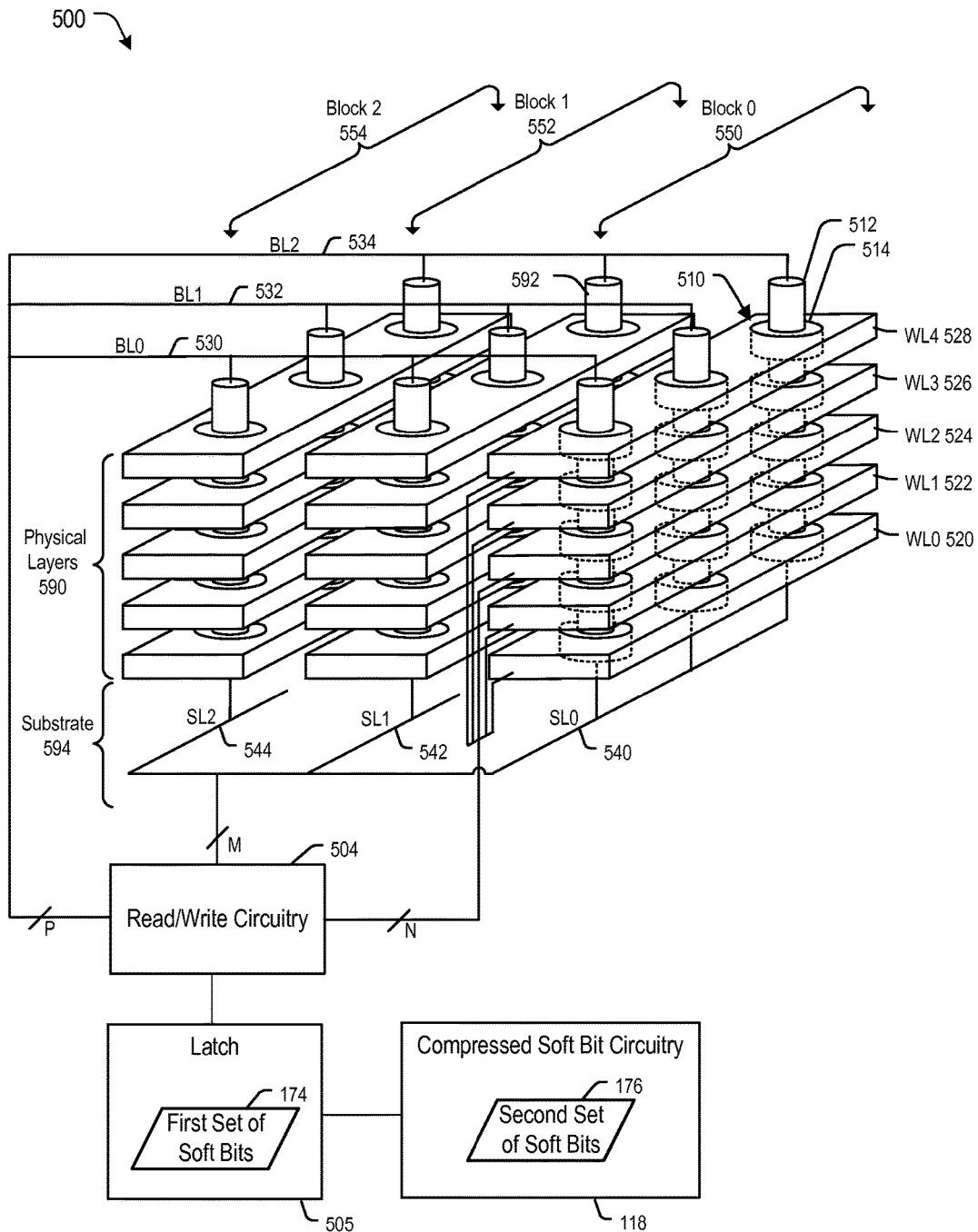
FIG. 5 is a diagram of an illustrative embodiment of a portion of a memory die that may be included in a data storage device, such as the data storage device of FIG. 1A.
Figure 6:
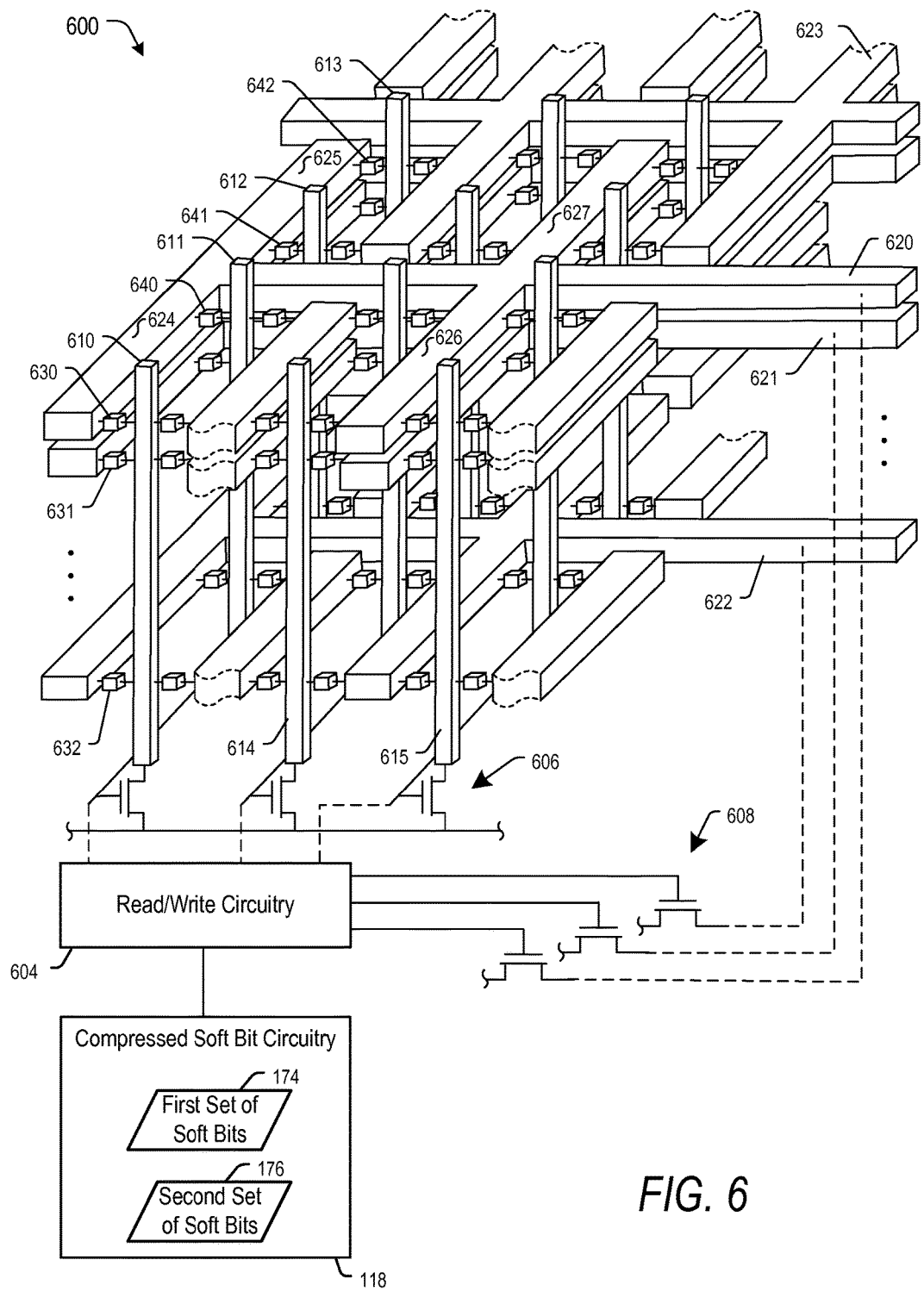
FIG. 6 is a diagram of another illustrative embodiment of a portion of a memory die that may be included in a data storage device, such as the data storage device of FIG. 1A.

FIGS. 5 and 6 illustrate certain examples of monolithic 3D memory configurations. It should be appreciated that FIGS. 5 and 6 are provided for illustration and that other implementations may utilize one or more other configurations, such as a planar memory configuration of the memory device 103 of FIG. 1A or a stacked die memory configuration of the memory device 103 of FIG. 1A, as illustrative examples.

FIG. 5 illustrates a portion of a memory die 500 having a NAND flash configuration. The memory die 500 may be included in the data storage device 102 of FIG. 1A. For example, the memory die 500 may correspond to or may be included in the memory device 103 of FIG. 1A. The memory die 500 may be coupled to the controller 130 of FIG. 1A.

The memory die 500 may include read/write circuitry 504 (e.g., the write read/circuitry 110) and one or more latches, such as a latch 505, which may correspond to any of the latches 112-116. The memory die 500 also includes the CSB circuitry 118.

The memory die 500 includes multiple physical layers, such as a group of physical layers 590. The multiple physical layers are monolithically formed above a substrate 594, such as a silicon substrate. Storage elements (e.g., memory cells), such as a representative memory cell 510, are arranged in arrays in the physical layers.

The representative memory cell 510 includes a charge trap structure 514 between a word line/control gate (WL4) 528 and a conductive channel 512. Charge may be injected into or drained from the charge trap structure 514 via biasing of the conductive channel 512 relative to the word line 528. For example, the charge trap structure 514 may include silicon nitride and may be separated from the word line 528 and the conductive channel 512 by a gate dielectric, such as silicon oxide. An amount of charge in the charge trap structure 514 affects an amount of current through the conductive channel 512 during a read operation of the memory cell 510 and indicates one or more bit values that are stored in the memory cell 510.

The memory die 500 includes multiple erase blocks, including a first block (block 0) 550, a second block (block 1) 552, and a third block (block 2) 554. Each block 550-554 includes a "vertical slice" of the physical layers 590 that includes a stack of word lines, illustrated as a first word line (WL0) 520, a second word line (WL1) 522, a third word line (WL2) 524, a fourth word line (WL3) 526, and a fifth word line (WL4) 528. Any of the word lines 520-528 may correspond to the storage region 106 of FIG. 1A. Multiple conductive channels (having a substantially vertical orientation with respect to FIG. 5) extend through the stack of word lines. Each conductive channel is coupled to a storage element in each word line 520-528, forming a NAND string of storage elements. FIG. 5 illustrates three blocks 550-554, five word lines 520-528 in each block, and three conductive channels in each block for clarity of illustration. However, the memory die 500 may have more than three blocks, more than five word lines per block, and more than three conductive channels per block.

The read/write circuitry 504 is coupled to the conductive channels via multiple conductive lines, illustrated as a first bit line (BL0) 530, a second bit line (BL1) 532, and a third bit line (BL2) 534 at a "top" end of the conducive channels (e.g., farther from the substrate 594). The read/write circuitry 504 is also coupled to the conductive channels via multiple source lines, such as via a first source line (SL0) 540, a second source line (SL1) 542, and a third source line (SL2) 544 at a "bottom" end of the conductive channels (e.g., nearer to or within the substrate 594). The read/write circuitry 504 is illustrated as coupled to the bit lines 530-534 via "P" control lines, coupled to the source lines 540-544 via "M" control lines, and coupled to the word lines 520-528 via "N" control lines. Each of P, M, and N may have a positive integer value based on the specific configuration of the memory die 500. In the illustrative example of FIG. 5, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 592 and a particular source line may be coupled to the top of the conductive channel 512. The bottom of the conductive channel 592 may be coupled (e.g., electrically coupled) to the bottom of the conductive channel 512. Accordingly, the conductive channel 592 and the conductive channel 512 may be coupled in series and may be coupled to the particular bit line and the particular source line.

In operation, the memory die 500 may perform write operations and read operations, such as in response to receiving commands from the controller 130. For a write operation, data (e.g., the data 108) may be stored at the latch 505.

The read/write circuitry 504 may be configured to access the data in the latch 505 and to program the data to storage elements of the memory die 500 based on one or more write parameters indicated by the particular command. For example, the read/write circuitry 504 may be configured to apply selection signals to control lines coupled to the word lines 520-528, the bit lines 530-534, and the source lines 540-542 to cause a programming voltage (e.g., a voltage pulse or series of voltage pulses) to be applied across one or more selected storage elements of the selected word line (e.g., the word line 528, as an illustrative example).

The read/write circuitry 504 may be configured to access the data stored at the memory die 500 to generate a representation of the data (e.g., a set of hard bits and a set of soft bits). For example, the memory die 500 may use the read/write circuitry 504 to sense storage elements of the memory die 500 to generate the representation of the data and may provide the representation of the data to the controller 130 (e.g., via the latch 505). In an illustrative example, the read/write circuitry 504 is configured to provide the first set of soft bits 174 to the latch 505, and the CSB circuitry 118 is configured to access the first set of soft bits 174 and to generate the second set of soft bits 176 based on the first set of soft bits 174. The CSB circuitry 118 may be configured to provide the second set of soft bits 176 to the controller 130 via the latch 505, via another latch, or using another technique.

The example of FIG. 5 illustrates that a compressed soft bit technique may be used in connection with a 3D memory. A 3D memory may increase data storage density at a data storage device (e.g., the data storage device 102 of FIG. 1A).

FIG. 6 illustrates a portion of a memory die 600 having a ReRAM configuration. The memory die 600 may be included in the data storage device 102 of FIG. 1A. For example, the memory die 600 may correspond to or may be included within the memory device 103 of FIG. 1A. The memory die 600 may be coupled to the controller 130 of FIG. 1A.

The memory die 600 may include read/write circuitry 604 and the CSB circuitry 118. In the example of FIG. 6, the memory die 600 includes a vertical bit line (VBL) ReRAM with a plurality of conductive lines in physical layers over a substrate (e.g., substantially parallel to a surface of the substrate), such as representative word lines 620, 621, 622, and 623 (only a portion of which is shown in FIG. 6). Any of the word lines 620-623 may correspond to the storage region 106 of FIG. 1A. The VBL ReRAM also includes a plurality of vertical conductive lines through the physical layers, such as representative bit lines 610, 611, 612, and 613. The word line 622 may include or correspond to a first group of physical layers, and the word lines 620, 621 may include or correspond to a second group of physical layers.

The memory die 600 also includes a plurality of resistance-based storage elements (e.g., memory cells), such as representative storage elements 630, 631, 632, 640, 641, and 642. Each of the storage elements 630, 631, 632, 640, 641, and 642 is coupled to (or is associated with) a bit line and a word line in arrays of memory cells in multiple physical layers over the substrate (e.g., a silicon substrate).

In the example of FIG. 6, each word line includes a plurality of fingers. To illustrate, the word line 620 includes fingers 624, 625, 626, and 627. Each finger may be coupled to more than one bit line. For example, the finger 624 of the word line 620 is coupled to the bit line 610 via the storage element 630 at a first end of the finger 624, and the finger 624 is further coupled to the bit line 611 via the storage element 640 at a second end of the finger 624.

In the example of FIG. 6, each bit line may be coupled to more than one word line. To illustrate, the bit line 610 is coupled to the word line 620 via the storage element 630, and the bit line 610 is further coupled to the word line 622 via the storage element 632.

In operation, the memory die 600 may perform write operations and read operations, such as in response to receiving commands from the controller 130 of FIG. 1A. For a write operation, the controller 130 of FIG. 1A may receive data from the accessing device 160 of FIG. 1A. The controller 130 may send a command to the memory die 600 to cause the memory die 600 to initiate the write operation. The controller 130 may send data to be written at storage elements of the memory die 500.

The read/write circuitry 604 may be configured to program the data to storage elements corresponding to the destination of the data. For example, the read/write circuitry 604 may apply selection signals to selection control lines coupled to the word line drivers 608 and the bit line drivers 606 to cause a write voltage to be applied across a selected storage element of the memory die 600. As an illustrative example, to select the storage element 630, the read/write circuitry 604 may activate the word line drivers 608 and the bit line drivers 606 to drive a programming current (also referred to as a write current) through the storage element 630. To illustrate, a first write current may be used to write a first logic value (e.g., a value corresponding to a high-resistance state) to the storage element 630, and a second write current may be used to write a second logic value (e.g., a value corresponding to a low-resistance state) to the storage element 630. The programming current may be applied by generating a programming voltage across the storage element 630 by applying a first voltage to the bit line 610 and to word lines other than the word line 620 and by applying a second voltage to the word line 620. In a particular embodiment, the first voltage is applied to other bit lines (e.g., the bit lines 614, 615) to reduce leakage current in the memory die 600.

For a read operation, the controller 130 may receive a request from a host device, such as the accessing device 160 of FIG. 1A. The controller 130 may issue a command to the memory die 600 specifying one or more physical addresses of the memory die 600, such as one or more physical addresses corresponding to a location of the memory die 600 that stores the data to be sensed.

The memory die 600 may cause the read/write circuitry 604 to read bits from particular storage elements of the memory die 600, such as by applying selection signals to selection control lines coupled to the word line drivers 608 and the bit line drivers 606 to cause a read voltage to be applied across a selected storage element. For example, to select the storage element 630, the read/write circuitry 604 may activate the word line drivers 608 and the bit line drivers 606 to apply a first voltage (e.g., 0.7 volts (V)) to the bit line 610 and to word lines other than the word line 620. A lower voltage (e.g., 0 V) may be applied to the word line 620. Thus, a read voltage is applied across the storage element 630, and a read current corresponding to the read voltage may be detected at a sense amplifier of the read/write circuitry 604. The read current corresponds (via Ohm's law) to a resistance state of the storage element 630, which corresponds to a logic value stored at the storage element 630.

In an illustrative example, the read/write circuitry 604 is configured to provide the first set of soft bits 174 to the CSB circuitry 118, and the CSB circuitry is configured to generate the second set of soft bits 176 based on the first set of soft bits 174. The CSB circuitry 118 may be configured to provide the second set of soft bits 176 to the controller 130 of FIG. 1A.

The example of FIG. 6 illustrates that a compressed soft bit technique may be used in connection with a 3D memory having a ReRAM configuration. A 3D memory may increase data storage density at a data storage device (e.g., the data storage device 102 of FIG. 1A).

Although the CSB circuitry 118 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform operations described herein, such as one or more operations of the method 300, one or more operations of the method 400, or a combination thereof. In a particular embodiment, the data storage device 102 includes a processor executing instructions (e.g., firmware) retrieved from the memory array 104. Alternatively or in addition, instructions that are executed by the processor may be retrieved from a separate memory location that is not part of the memory array 104, such as at a read-only memory (ROM).

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

The data storage device 102 may be coupled to, attached to, or embedded within one or more accessing devices, such as within a housing of the accessing device 160. For example, the data storage device 102 may be embedded within the accessing device 160 in accordance with a Joint Electron Devices Engineering Council (JEDEC) Solid State Technology Association Universal Flash Storage (UFS) configuration. To further illustrate, the data storage device 102 may be integrated within an electronic device (e.g., the accessing device 160), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 102 may be implemented in a portable device configured to be selectively coupled to one or more external devices, such as a host device. For example, the data storage device 102 may be removable from the accessing device 160 (i.e., "removably" coupled to the accessing device 160). As an example, the data storage device 102 may be removably coupled to the accessing device 160 in accordance with a removable universal serial bus (USB) configuration.

The accessing device 160 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The accessing device 160 may communicate via a controller, which may enable the accessing device 160 to communicate with the data storage device 102. The accessing device 160 may operate in compliance with a JEDEC Solid State Technology Association industry specification, such as an embedded MultiMedia Card (eMMC) specification or a Universal Flash Storage (UFS) Host Controller Interface specification. The accessing device 160 may operate in compliance with one or more other specifications, such as a Secure Digital (SD) Host Controller specification as an illustrative example. Alternatively, the accessing device 160 may communicate with the data storage device 102 in accordance with another communication protocol. In some implementations, the system 100, the data storage device 102, or the memory array 104 may be integrated within a network-accessible data storage system, such as an enterprise data system, an NAS system, or a cloud data storage system, as illustrative examples.

In some implementations, the data storage device 102 may include a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the accessing device 160 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the accessing device 160 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory array 104 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory array 104 may include another type of memory. In a particular embodiment, the data storage device 102 is indirectly coupled to an accessing device (e.g., the accessing device 160) via a network. For example, the data storage device 102 may be a network-attached storage (NAS) device or a component (e.g., a solid-state drive (SSD) component) of a data center storage system, an enterprise storage system, or a storage area network. The memory array 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
   a controller; and
   a memory device including
      a memory;
      a first circuit configured to
         determine one or more delta values as a function of a compression rate, each delta value indicating a difference between a hard bit sensing threshold and a soft bit sensing threshold, and
         sense data stored at the memory based on the one or more delta values to generate a first set of soft bits having a first number of bits; and
      a second circuit configured to
         perform an operation using the first set of soft bits to generate a second set of soft bits having a second number of bits that is less than the first number of bits, the first number of bits and the second number of bits corresponding to the compression rate; and
         provide the second set of soft bits to the controller,
      wherein the second circuit includes a compressed soft bit (CSB) circuitry configured to compress the first set of soft bits to generate the second set of soft bits in accordance with a lossy compression scheme, and wherein the lossy compression scheme including a bitwise AND operation using a first bit of a subset of the first set of soft bits and a second bit of the subset of the first set of soft bits to generate a third bit of the second set of soft bits.

2. The data storage device of claim 1, wherein the memory includes a storage region configured to store the data using a single-bit-per-cell or multiple-bits-per-cell data storage scheme and wherein the operation includes compressing the first set of soft bits to generate the second set of soft bits.

3. The data storage device of claim 1, wherein the memory includes a storage region configured to store the data, and wherein the first set of soft bits includes one or more soft bits associated with a neighbor region of the storage region.

4. The data storage device of claim 1, wherein the compression rate corresponds to a ratio of the first number of bits and the second number of bits.

5. The data storage device of claim 1, wherein the second circuit includes a set of latches.

6. The data storage device of claim 1, wherein the first circuit includes read/write circuitry.

7. A method comprising:
   in a data storage device that includes a controller coupled to a memory device, wherein the memory device includes a memory, performing by the memory device:
      determining one or more delta values as a function of a compression rate, each delta value indicating a difference between a hard bit sensing threshold and a soft bit sensing threshold;
      in response to receiving a read command from the controller, sensing data stored at the memory based on the one or more delta values to generate a first set of soft bits having a first bit count;
      performing an operation using the first set of soft bits to generate a second set of soft bits having a second bit count that is less than the first bit count, wherein the first bit count and the second bit count correspond to the compression rate, wherein performing the operation includes compressing the first set of soft bits to generate the second set of soft bits in accordance with a lossy compression scheme, and wherein the lossy compression scheme including a bitwise AND operation using a first bit of a subset of the first set of soft bits and a second bit of the subset of the first set of soft bits to generate a third bit of the second set of soft bits; and providing the second set of soft bits to the controller.

8. The method of claim 7, wherein performing the operation includes performing a bitwise operation using a subset of the first set of soft bits to generate a particular soft bit of the second set of soft bits.

9. The method of claim 7, wherein the first bit and the second bit have a common bit position and are sensed from a common storage element of the memory.

10. The method of claim 9, wherein the first bit is stored at the common storage element using one of an upper page, a middle page, a lower page or one or more other logical pages, and wherein the second bit is stored at the common storage element using one other of the upper page, the middle page, the lower page, or the one or more other logical pages.

11. The method of claim 7, wherein the first set of soft bits represents a single logical page, and wherein the operation corresponds to an intra-page compression operation.

12. The method of claim 7, wherein the first set of soft bits represents multiple logical pages, and wherein the operation corresponds to an inter-page compression operation.

13. The method of claim 7, wherein the data includes a set of hard bits representing multiple logical pages, and wherein the first set of soft bits represents a subset of the multiple logical pages.

14. The method of claim 13, further comprising providing a non-compressed representation of a particular logical page of the multiple logical pages to the controller, wherein the particular logical page is associated with a higher bit-error rate (BER) as compared to each of the other multiple logical pages.

15. The method of claim 14, wherein performing the operation includes compressing a first logical page of the multiple logical pages and a second logical page of the multiple logical pages without compressing the particular logical page.

16. The method of claim 7, further comprising:
after providing the second set of soft bits to the controller, receiving a message; and
in response to receiving the message, generating a third set of soft bits corresponding to the data, the third set of soft bits having a third bit count that is less than the first bit count and that is greater than the second bit count.

17. The method of claim 16, further comprising increasing a compression ratio in response to receiving the message from the controller.

18. An apparatus comprising:
means for storing data;
means for determining one or more delta values as a function of a compression rate, each delta value indicating a difference between a hard bit sensing threshold and a soft bit sensing threshold;
means for sensing the data based on the one or more delta values to generate a first set of soft bits having a first number of bits;
means for performing an operation using the first set of soft bits to generate a second set of soft bits having a second number of bits that is less than the first number of bits, wherein the first number of bits and the second number of bits correspond to the compression rate, wherein the means for performing the operation is configured to compress the first set of soft bits to generate the second set of soft bits based on a lossy compression scheme, and wherein the lossy compression scheme including a bitwise AND operation using a first bit of a subset of the first set of soft bits and a second bit of the subset of the first set of soft bits to generate a third bit of the second set of soft bits; and
means for providing the second set of soft bits to the controller.

19. The apparatus of claim 18, wherein the means for storing data includes a first storage region configured to store the data, and wherein the first set of soft bits includes one or more soft bits sensed from a second storage region that is adjacent to the first storage region.

20. The apparatus of claim 18, wherein the means for performing the operation is configured to perform a bitwise operation using a subset of the first set of soft bits to generate a particular soft bit of the second set of soft bits.

21. The apparatus of claim 18, wherein the first bit and the second bit have a common bit position and are associated with a common storage element of the means for storing the data.

22. The apparatus of claim 18, wherein the first set of soft bits represents a single logical page, and wherein the operation comprises an intra-page compression operation.

23. The apparatus of claim 18, wherein the first set of soft bits represents multiple logical pages, and wherein the operation comprises an inter-page compression operation.

24. The data storage device of claim 1, further comprising a decoder configured to decode a representation of the data using the second set of soft bits based on a compressed soft bit (CSB) decoding technique.

25. The data storage device of claim 24, wherein the decoder includes a plurality of CSB nodes configured to receive the second set of soft bits.

26. The data storage device of claim 25, wherein the decoder further includes:
a plurality of variable nodes coupled to the plurality of CSB nodes; and
a plurality of check nodes coupled to the plurality of variable nodes,
wherein each CSB node of the plurality of CSB nodes is coupled to a particular number of variable nodes of the plurality of variable nodes, the particular number corresponding to the compression rate.

* * * * *